United States Patent
Bungo et al.

(10) Patent No.: US 10,655,922 B2
(45) Date of Patent: May 19, 2020

(54) LAMINATED HEAT SINK

(71) Applicant: T.RAD CO., LTD., Tokyo (JP)

(72) Inventors: Takuya Bungo, Tokyo (JP); Atsushi Okubo, Tokyo (JP); Taiji Sakai, Tokyo (JP)

(73) Assignee: T.RAD Co., Ltd., Tokyo (JP)

( * ) Notice: Subject to any disclaimer, the term of this patent is extended or adjusted under 35 U.S.C. 154(b) by 23 days.

(21) Appl. No.: 15/754,505

(22) PCT Filed: Sep. 14, 2016

(86) PCT No.: PCT/JP2016/078132
§ 371 (c)(1),
(2) Date: Feb. 22, 2018

(87) PCT Pub. No.: WO2017/047825
PCT Pub. Date: Mar. 23, 2017

(65) Prior Publication Data
US 2018/0245862 A1 Aug. 30, 2018

(30) Foreign Application Priority Data

Sep. 18, 2015 (JP) .................................. 2015-184706

(51) Int. Cl.
| F28F 13/00 | (2006.01) |
| H01L 23/473 | (2006.01) |
| F28D 1/03 | (2006.01) |
| F28F 13/08 | (2006.01) |
| F28F 3/04 | (2006.01) |
| H05K 7/20 | (2006.01) |
| F28F 3/08 | (2006.01) |
| F28D 21/00 | (2006.01) |

(52) U.S. Cl.
CPC .......... *F28F 13/003* (2013.01); *F28D 1/0325* (2013.01); *F28F 3/04* (2013.01); *F28F 3/086* (2013.01); *F28F 13/08* (2013.01); *H01L 23/473* (2013.01); *H05K 7/20927* (2013.01); *F28D 2021/0029* (2013.01)

(58) Field of Classification Search
CPC .......... F28F 13/003; F28F 3/086; F28F 13/08; F28F 3/04; H01L 23/473; F28D 1/0325; F28D 2021/0029; H05K 7/20927
See application file for complete search history.

(56) References Cited

U.S. PATENT DOCUMENTS

| 4,397,234 | A | * | 8/1983 | Lee | B41J 9/127 |
| | | | | | 101/93.29 |
| 5,274,920 | A | * | 1/1994 | Matthews | F28F 3/12 |
| | | | | | 165/80.4 |
| 6,989,134 | B2 | * | 1/2006 | Tonkovich | B01F 5/061 |
| | | | | | 165/167 |
| 6,994,245 | B2 | * | 2/2006 | Pinchot | B01J 19/0093 |
| | | | | | 165/166 |

(Continued)

FOREIGN PATENT DOCUMENTS

| JP | 2008-171840 A | 7/2008 |
| JP | 2013-030713 A | 2/2013 |

(Continued)

*Primary Examiner* — Ljiljana V. Ciric
(74) *Attorney, Agent, or Firm* — Norris McLaughlin, P.A.

(57) ABSTRACT

A heat sink made from laminated plates and formed with spaced apart ribs and slits positioned so as to control circulation of refrigerant over the heat sink during cooling of an object by the heat sink.

8 Claims, 9 Drawing Sheets

(56) References Cited

U.S. PATENT DOCUMENTS

| | | | | |
|---|---|---|---|---|
| 7,247,030 | B2* | 7/2007 | Hilty | H01R 9/2658 439/607.05 |
| 8,122,909 | B2* | 2/2012 | Tonkovich | B01F 5/0611 137/833 |
| 8,585,990 | B2* | 11/2013 | Moon | B01J 19/0093 422/603 |
| 9,333,477 | B2* | 5/2016 | Park | B01J 19/0093 |
| 9,599,407 | B2* | 3/2017 | Deane | A23C 3/0332 |
| 10,203,165 | B2* | 2/2019 | Longis | F24H 7/0216 |
| 2003/0152488 | A1* | 8/2003 | Tonkovich | B01F 5/0604 422/400 |
| 2003/0179596 | A1* | 9/2003 | Joseph | H02M 7/003 363/141 |
| 2005/0133212 | A1* | 6/2005 | Wilson | F28D 15/0266 165/168 |
| 2005/0189342 | A1* | 9/2005 | Kabbani | H01L 23/473 219/494 |
| 2007/0163765 | A1* | 7/2007 | Rondier | H01L 23/473 165/170 |
| 2007/0246204 | A1* | 10/2007 | Lai | F28F 3/086 165/166 |
| 2009/0165996 | A1* | 7/2009 | Lynch | H01L 23/467 165/80.3 |
| 2009/0326279 | A1* | 12/2009 | Tonkovich | B01F 5/0475 568/487 |
| 2010/0032147 | A1* | 2/2010 | Valenzuela | F28F 3/12 165/163 |
| 2011/0226448 | A1* | 9/2011 | Valenzuela | F28F 3/12 165/109.1 |
| 2014/0231055 | A1* | 8/2014 | Schalansky | F28F 3/086 165/166 |
| 2016/0129792 | A1 | 5/2016 | Gohara et al. | |
| 2019/0335617 | A1* | 10/2019 | Bodenweber | H01L 23/3672 |
| 2019/0393133 | A1* | 12/2019 | Asai | B60K 11/02 |

FOREIGN PATENT DOCUMENTS

| | | |
|---|---|---|
| JP | 2013-235976 A | 11/2013 |
| JP | 2014-033063 A | 2/2014 |
| WO | 2015/079643 A1 | 6/2015 |

* cited by examiner

LAMINATED HEAT SINK

BACKGROUND OF THE INVENTION

The present invention relates to a compact laminated type heat sink that cools an object to be cooled (as an example, a semiconductor element such as an inverter, and the like).

In Japanese Patent Laid-Open No. 2014-33063, a laminated type heat sink is proposed.

This is fabricated, as illustrated in FIG. 11, by press-molding a metal flat plate to form a pair of manifolds (not illustrated), and drilling a plurality of slits 2 between these. Between each of the slits 2, a fin part is formed by long and thin longitudinal ribs 3 that are in parallel to each other and transverse ribs 4 that link between the adjacent longitudinal ribs 3 to constitute a flat plate. Further, lamination is performed so that, in the fin part of each plate, the longitudinal ribs 3 thereof are matched with each other and the transverse ribs 4 are offset in the length direction of the plate from each other.

On both ends in the lamination direction of the laminated body of plates, an end lid 7 is arranged, a semiconductor element such as an inverter is mounted on the end lid 7, and a refrigerant is circulated into the fin part of each plate via the manifold.

SUMMARY OF THE INVENTION

It was made clear by experiments of the present inventor that, in a case where an inlet and outlet of a refrigerant were arranged to an end lid and a refrigerant was fed to a fin part of each plate via a manifold, heat exchange was more active in a place nearer to a semiconductor element and quantity of heat exchange decreased in a place farther from the element in a lamination direction.

In FIG. 6, in a case where objects 8a, 8b, and 8c to be cooled are arranged to an end lid (which is omitted in FIG. 6), ranges in which heat exchange is performed actively are respective ranges formed in a reverse trapezoidal shape downward and shown by dotted cross-section areas and cross-hatched cross-section areas of the refrigerant.

Conversely, cross-section areas of the refrigerant neither dotted nor cross-hatched are illustrated by trapezoids rising from a lower side toward an upper side in which in which heat exchange is less likely to be performed.

Consequently, the present invention aims at feeding a refrigerant predominantly to portions in which heat exchange is actively performed to totally accelerate heat exchange.

A first aspect of the present invention is a laminated type heat sink, in which:

the laminated type heat sink comprises a plurality of flat plates (6) each including a metal flat plate provided with a pair of manifold parts (1) facing each other, and, between the manifold parts (1), a fin part (5) with a plurality of slits (2) punched out in parallel to each other, and a plurality of thin and long longitudinal ribs (3) in parallel to each other and transverse ribs (4) linking adjacent respective longitudinal ribs (3) formed between the slits (2);

respective plates (6) are laminated so that, with respect to each of fin parts (5) of respective plates (6), the longitudinal ribs (3) are matched with each other and positions of the transverse ribs (4) are offset in a longitudinal rib (3) direction from each other, and an end lid (7) is arranged to both ends thereof in a lamination direction; and a refrigerant is circulated to each of the slits (2) in a longitudinal rib (3) direction and an object (8) to be cooled is joined to the end lid (7), wherein a circulation blocking means (9) for a refrigerant is provided so that refrigerant circulation resistance in the fin part (5) of the plate (6) at a position sufficiently apart in a lamination direction from the object (8) to be cooled is greater than circulation resistance in each plate (6) lying close to the object (8) to be cooled.

A second aspect of the present invention is the laminated type heat sink according to the first aspect, wherein:

as the circulation blocking means (9), a second plate (6a), in which a periphery and manifold part (1) are matched with the respective plates (6) and the fin part (5) is different from that of others, is arranged in a position apart from the object (8) to be cooled; and in the second plate (6a), the plurality of slits (2) is formed in a projection position of the object (8) to be cooled and other parts are formed into a blank part (11) without a slit.

A third aspect of the present invention is the laminated type heat sink according to the first aspect, wherein:

as the circulation blocking means (9), a third plate (6b) having a fin part different from the fin part (5) is arranged in a position sufficiently apart in a laminate direction from the object (8) to be cooled while a periphery and manifold part (1) are matched with the respective plates (6);

to the third plate (6b), a blockade wall (14) rising orthogonally to a plane is arranged in a part on a side orthogonal to circulation direction of a refrigerant; and a position that is a side part of the each plate (6) apart, when an object (8) to be cooled is projected to each plate (6), only that portion of the plate is not blockaded with the blockade wall (14).

A fourth aspect of the present invention is the laminated type heat sink of the first aspect, wherein:

the circulation blocking means (9) includes a barrier body (15) that is arranged in a position sufficiently apart in a lamination direction from the object (8) to be cooled, has a width being matched with the manifold part (1), and is a member separate from a plate (6) which has at least an L letter-like part (15a) in the horizontal section; and a position of a side wall that is a side part of the each plate (6) apart, when the object (8) to be cooled is projected to each plate (6), only that portion of the plate is not blockaded with the L letter-like part (15a) of the barrier body (15).

A fifth aspect of the present invention is a laminated type heat sink, in which:

the laminated type heat sink comprises a plurality of flat plates (21) each including a metal flat plate provided with a fin part (5) with a plurality of slits (2) punched out in parallel to each other, and a plurality of thin and long longitudinal ribs (3) in parallel to each other and transverse ribs (4) linking adjacent respective longitudinal ribs (3) formed between the slits (2);

respective plates (21) are laminated so that, with respect to each of fin parts (5) of respective plates (21), the longitudinal ribs (3) are matched with each other and positions of the transverse ribs (4) are offset in a longitudinal rib (3) direction from each other to form a core (18);

a casing (19) formed in a dish-like shape on at least one side is included and the core (18) is housed in the casing (19); and a refrigerant is circulated into each of the slits (2) in a longitudinal rib (3) direction and an object (8) to be cooled is joined to the casing (19), wherein a circulation blocking means (9) for a refrigerant is provided so that refrigerant circulation resistance in a fin part (5) of a plate (21) at a position sufficiently apart in a lamination direction from the object (8) to be cooled is greater than circulation resistance in each plate (21) lying close to the object (8) to be cooled.

A sixth aspect of the present invention is the laminated type heat sink of the fifth aspect, wherein:

as the circulation blocking means (9), a second plate (21a) having a fin part different from the fin part (5) of others is included in a position apart from the object (8) to be cooled; and in the second plate (21a), the plurality of slits (2) is formed in a projection position of the object (8) to be cooled and other parts are formed into a blank part (11) without a slit.

A seventh aspect of the present invention is the laminated type heat sink the fifth aspect, wherein:

as the circulation blocking means (9), a third plate (21b) having a fin part different from the fin part (5) is arranged in a position sufficiently apart in a lamination direction from the object (8) to be cooled;

to the third plate (21b), a blockade wall (14) rising orthogonally to a plane is arranged in a part on a side perpendicular to a flow direction of a refrigerant; and a position that is a side part of the each plate (21) apart, when an object (8) to be cooled is projected to each plate (21), only that portion of the plate is not blockaded with the blockade wall (14).

An eighth aspect of the present invention is the laminated type heat sink of the fifth aspect, wherein:

the core (18) is arranged in the casing (19) via a manifold part (20), and, between the core (18) and an inner wall of the casing (19), a barrier body (15) that is a member separate from the plate (21) is interposed; and the barrier body (15) has at least an L letter-like part (15a) in a horizontal section, and a position of a side wall that is a side part of the each plate (21) apart, when the object (8) to be cooled is projected to each plate (21), only that portion of the plate is not blockaded with the L letter-like part (15a) of the barrier body (15).

Advantageous Effects of Invention

The laminated type heat sink of the present invention is provided with a circulation blocking means 9 for a refrigerant so that, in positions sufficiently apart in a lamination direction from an object 8 to be cooled, a circulation path of a refrigerant in a fin part of respective plates 6 decreases in a lower portion of the respective plates 6.

Consequently, the refrigerant can be circulated in a larger quantity into plates nearer to the object 8 to be cooled to accelerate heat exchange.

The laminated type heat sink of the second aspect has, in the above configuration, a second plate 6a with the plurality of slits 2 formed in a projection position of the object 8 to be cooled and other parts formed into a blank part 11 without a slit.

As the result of the configuration, a fluid is not circulated into the blank part 11 of the second plate 6a that does not actively contribute to cooling and the refrigerant can be circulated into other portions to accelerate heat exchange.

The laminated type heat sink of the third aspect is characterized in that, in connection with the first aspect, a third plate 6b thereof includes a blockade wall 14 rising orthogonally to a plane in a part on a side orthogonal to a refrigerant flow direction, and a position of the side part that is a side part of the each plate 6 apart, when the object 8 to be cooled is projected to each plate 6, only that portion of the plate is not blockaded with the blockade wall 14.

As the result of the configuration, one third plate 6b blockades a side portion of other plate 6 and, without circulating a fluid into a portion of the plate 6 that does not actively contribute to cooling, the refrigerant can be circulated into other portions to accelerate heat exchange.

The laminated type heat sink of the fourth aspect is characterized, in connection with the first aspect, by having a barrier body 15 that is a separate member from the plate 6, and blockading a side part of the respective plates 6 with an L letter-like part 15a of the barrier body 15.

According to the invention, while the shape of all the plates 6 is set to be identical with each other, circulation of the refrigerant into portions of the respective plates 6 which do not actively contribute to cooling can be blocked with the barrier body 15 and, consequently, heat exchange can be accelerated as a whole heat exchanger.

In the laminated type heat sink of the fifth to eighth aspects, a core 18 including a laminated body of a plate 21 is internally mounted in a casing 19. Consequently, a laminated type heat sink that has a simple structure and is easily manufactured and assembled can be provided.

DETAILED DESCRIPTION OF THE INVENTION

Next, on the basis of the drawings, embodiments of the present invention will be explained.

Example 1

Figure 1:
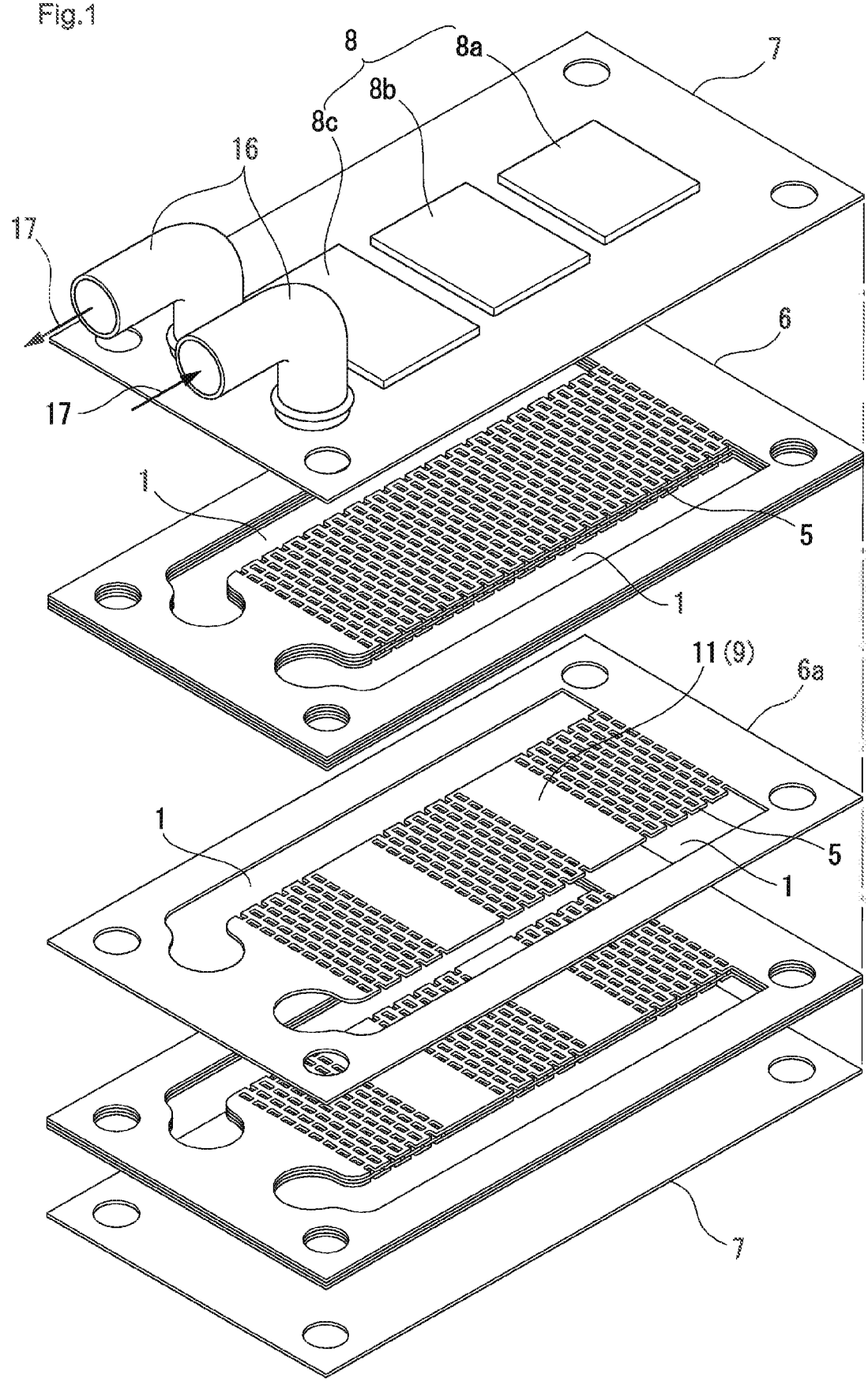
FIG. 1 illustrates an exploded perspective view of a laminated type heat sink of the present invention.
Figure 2:
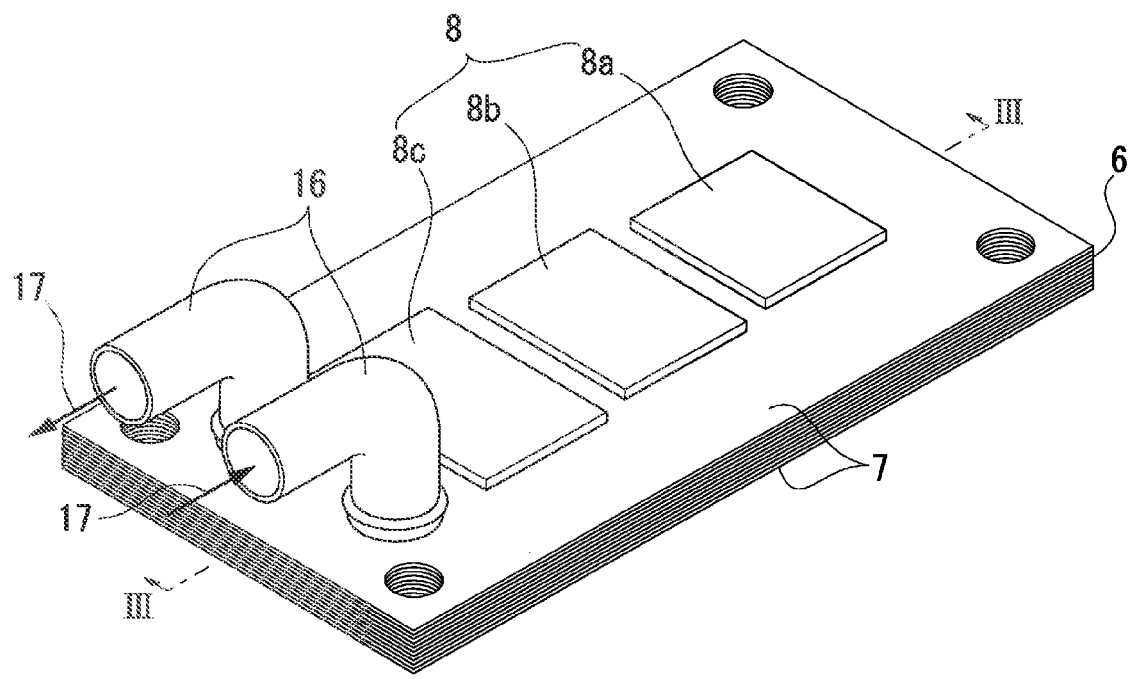
FIG. 2 illustrates a perspective view showing an assembled state of the same.
Figure 3:
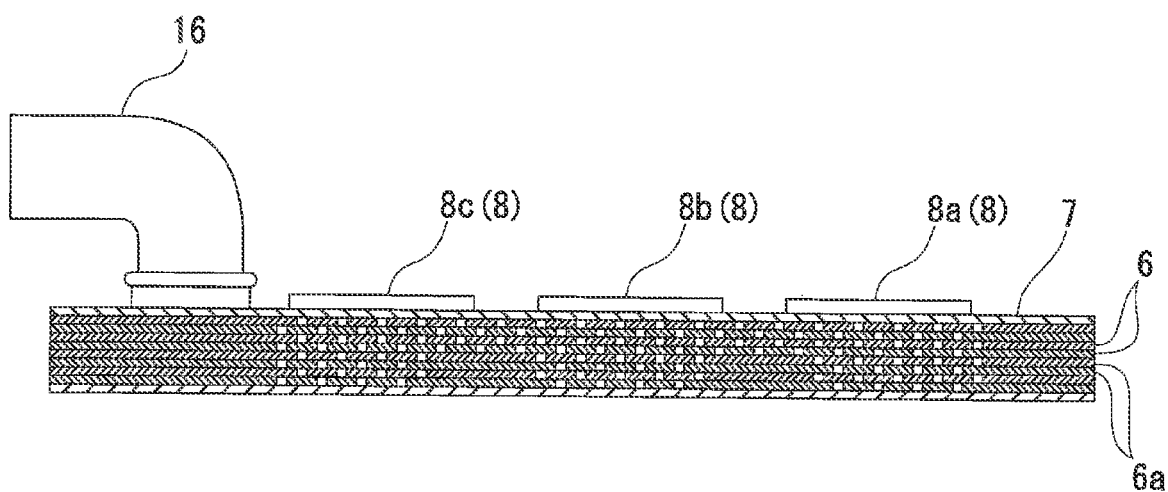
FIG. 3 illustrates a cross-sectional view along a arrow in FIG. 2.

FIG. 1 illustrates an exploded perspective view of a heat sink of the present invention, FIG. 2 illustrates an assembled state of the same, and FIG. 3 illustrates a longitudinal cross-sectional view of the assembled state.

In the example, a core is formed by a laminated body of a plurality of plates 6 and second plates 6a, and an end lid 7 is arranged to both upper and lower ends of the core. Then, each of plates is integrally brazed to each other.

Figure 11:
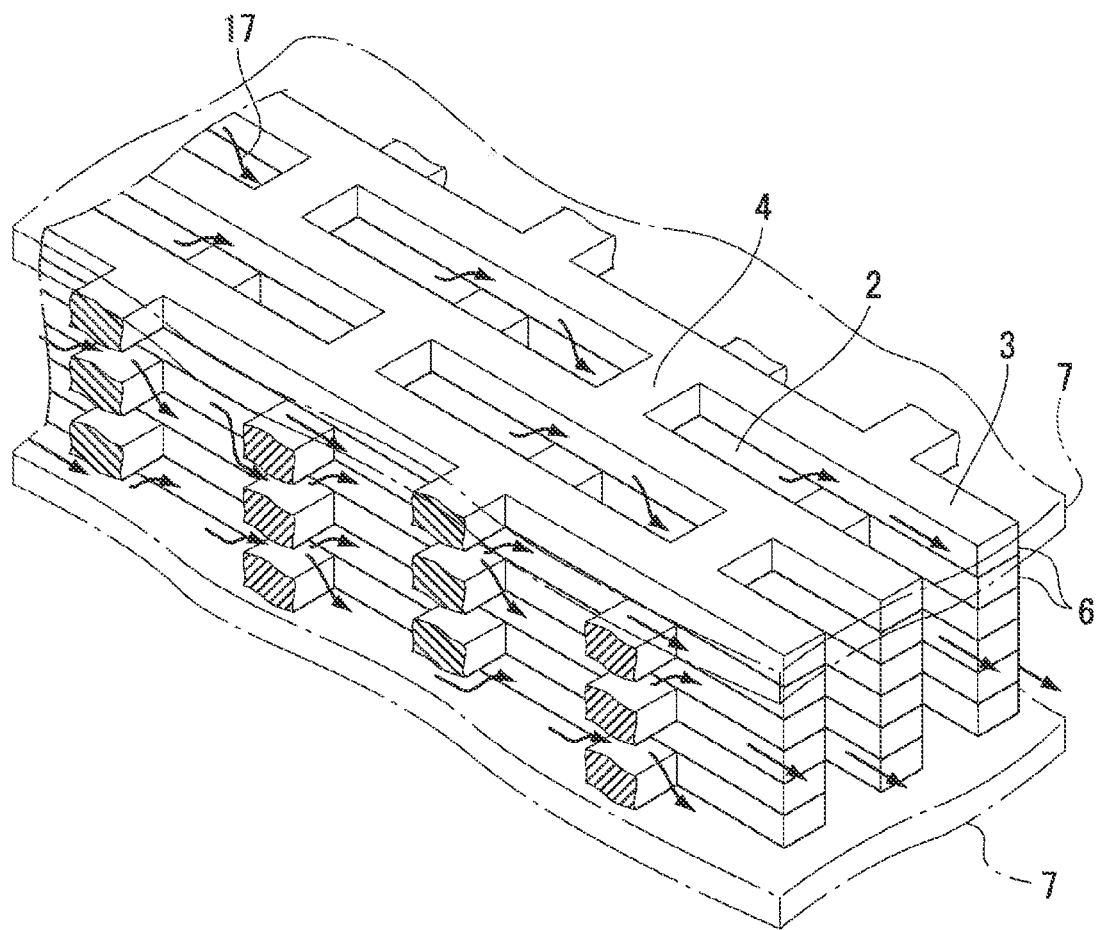
FIG. 11 illustrates a principal part perspective view of a laminated type heat sink of a conventional type.

The plate 6 lying on the end lid 7 side is the plate of a conventional type illustrated in FIG. 11, in which a pair of manifold parts 1 in parallel to each other are formed on both sides in a width direction of a metal flat plate, and, between the respective manifold parts 1, a fin part 5 is arranged. The fin part 5 is formed as the conventional one illustrated in FIG. 11, a plurality of slits 2 is arranged in parallel, longitudinal ribs 3 are arranged between the respective slits 2, and transverse ribs 4 link between the respective longitudinal ribs 3. Then, each of the slits 2 is matched with each other and laminated, and each of the transverse ribs 4 is arranged in a different position for each of adjacent plates.

Next, the second plate 6a arranged in a position apart from the end lid 7 lies on a lower side in a lamination direction, as illustrated in FIG. 1. That is, it is the second plate 6a arranged farther relative to the end lid 7 having an object 8 to be cooled, and the fin part 5 and a blank part 11 are arranged alternately between the manifold parts 1. In the example, three objects 8 to be cooled, that is, 8a to 8c are joined on the end lid 7, but the number of objects to be cooled is not limited to this.

In the example, a pair of inlet/outlet pipes 16 are arranged to the end lid 7 on the upper side, each of which is communicated with the pair of manifold parts 1 of each of the plates 6 and second plates 6a. Then, as illustrated in FIG. 2, to the end lid 7 on the upper side, the objects 8a to 8c to be cooled (as an example, semiconductor elements) are arranged. Then, from one side of the pair of manifold parts 1, a refrigerant 17 is fed to each manifold part 1 of each of the plates 6 and second plates 6a, which winds in up/down directions through the slit 2 in the fin part 5 thereof and circulates from one manifold part 1 to the other manifold part 1.

Figure 6:
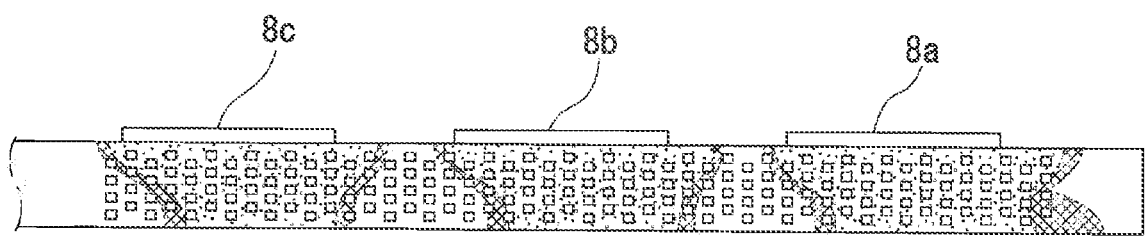
FIG. 6 illustrates an explanatory view showing heat exchange regions in a longitudinal section of a heat sink.

At this time, the refrigerant 17 circulates evenly through the slit of each of the fin parts 5 in the plate 6 lying near the end lid 7 on the upper side. However, in the second plate 6a more apart from the end lid 7 on the upper side, the refrigerant 17 does not circulate into the blank part 11 (which constitutes a circulation blocking means 9 of the present invention), and circulates only into a part of the fin part 5 of the second plate 6a. Thus the refrigerant 17 is fed intensively to the fin part 5. Consequently, in regions in which heat exchange is less in FIG. 6 (portions rising in a trapezoid-like shape from a lower side), the refrigerant is fed only to the fin part 5 and not fed to the blank part 11. Consequently, the refrigerant is fed to the fin part 5 more effectively to accelerate heat exchange as a whole.

Meanwhile, in the Example, the objects 8a to 8c to be cooled are arranged only to the end lid 7 on the upper side, but an object to be cooled can also be arranged to the end lid 7 on the lower side together with the end lid 7 on the upper side. In this case, the plurality of second plates 6a is arranged at a middle height, and, on both sides thereof, a laminated body of the ordinary plate 6 is arranged.

Example 2

Figure 4:
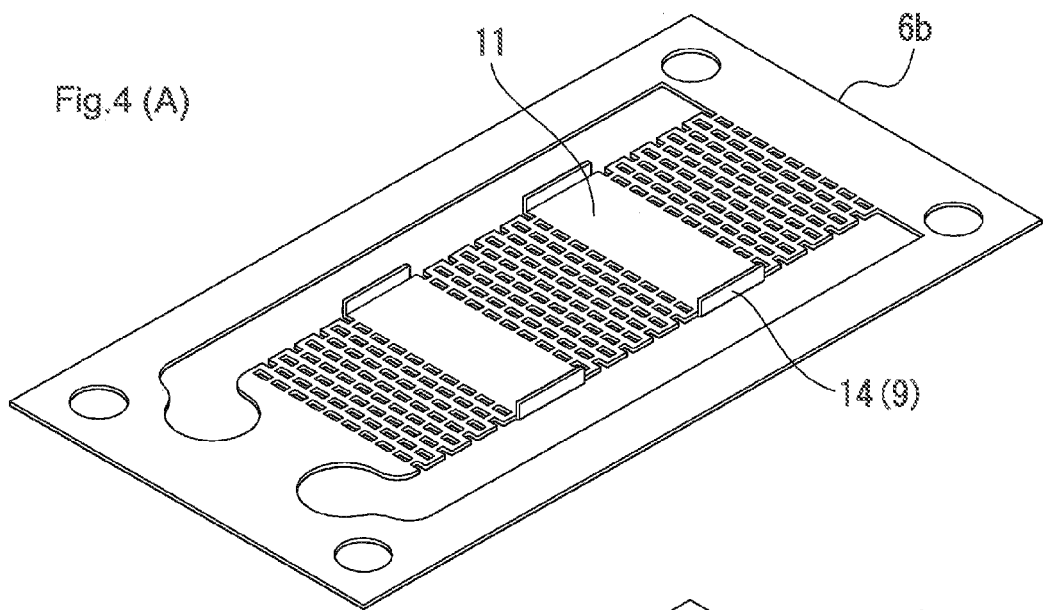
FIG. 4 illustrates perspective views showing a third plate 6b for use in second Example of the present invention and a core of a heat sink using the same.
Figure 4:
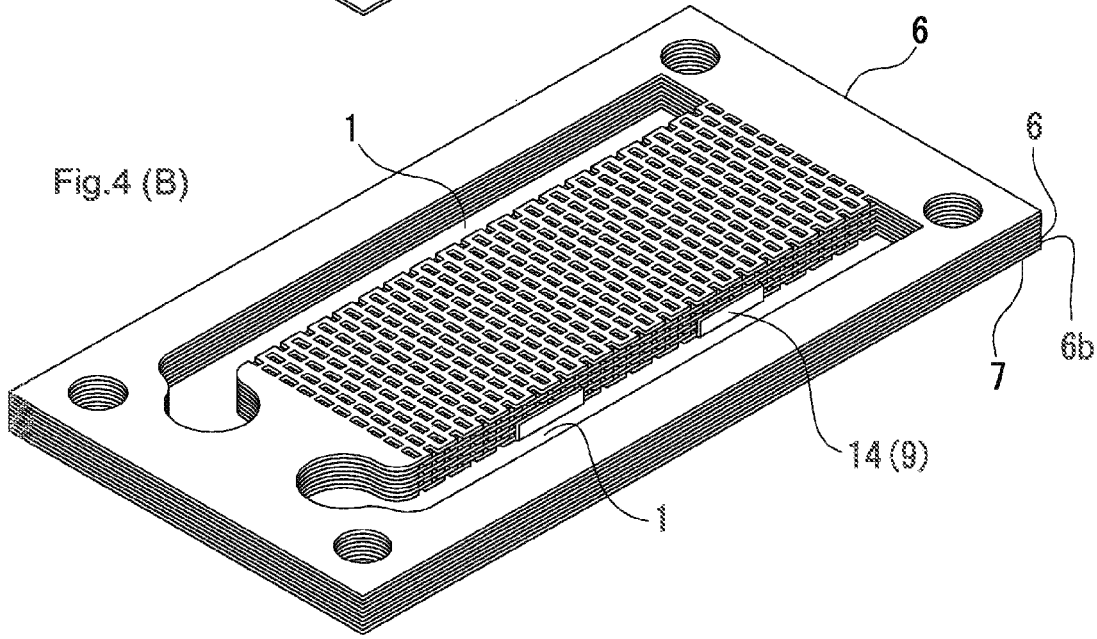

Next, FIG. 4 illustrates a core part of a heat sink in second Example of the present invention, and a third plate 6b used for the core part.

In the example, in a middle of a third plate 6b lying at the lowest end, the pair of blank parts 11 are provided and, on both sides in a width direction of the blank part 11, a blockade wall 14 is raised, which constitutes the circulation blocking means 9 of the present invention. In the example, the core part includes a laminated body in which only a plate lying at the lowest end in a lamination direction is the third plate 6b and all the other plates are the conventional plate 6. The blockade walls 14 of the third plate 6b lying at the lowest end blockade, respectively, both sides of the plate 6 lying on a lower side as in FIG. 4(B). Then, the refrigerant fed to each of the manifold parts 1 is blocked to circulate into the inside of the fin by the blockade wall 14. Also in the example, an object to be cooled is arranged to a not illustrated end lid lying at the highest end.

Meanwhile, when an object to be cooled is arrange to both sides, that is, to an upper end lid and lower end lid, the blockade walls 14 in vertically reversed directions are mounted, respectively, on not illustrated two third plates 6b lying in the middle.

Example 3

Figure 5:
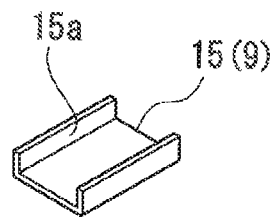
FIG. 5 illustrates perspective views showing a barrier body 15 in third Example of the present invention and a core of a heat sink using the same.
Figure 5:
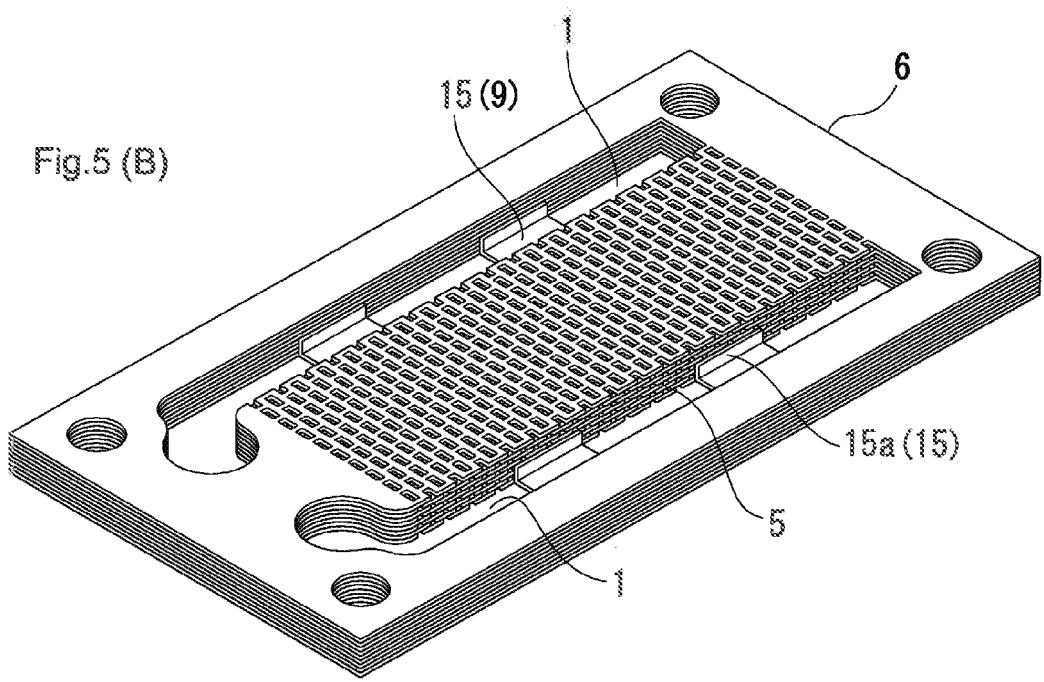

Next, FIG. 5 illustrates third Example of the present invention. In the example, a core is formed by a laminated body of the ordinary plate 6, and, to each manifold part 1 thereof, a barrier body 15 illustrated in FIG. 5(A) is arranged. The barrier body 15 has a width equal to the width of the manifold part 1, and a length equal to the base arranged in a trapezoid-like shape from a lower side toward an upper side in FIG. 6. Then the barrier body 15 is arranged to a position of the upward trapezoid-like shape in FIG. 6. The barrier body 15 forms the circulation blocking means 9 of the present invention. Meanwhile, in FIG. 5, the example is also an example in which an object to be cooled is arranged to a not illustrated upper end lid, and the same can also be arranged to a lower end lid. In this case, the barrier bodies 15 in vertically reversed directions are arranged on a plate part lying in the middle. Then, a part of the fin part 5 of each of the plates 6 is partially blockaded by each L letter-like part 15a.

Consequently, the refrigerant in the manifold part 1 is fed effectively to portions other than the L letter-like part 15a to accelerate heat exchange.

Figure 7:
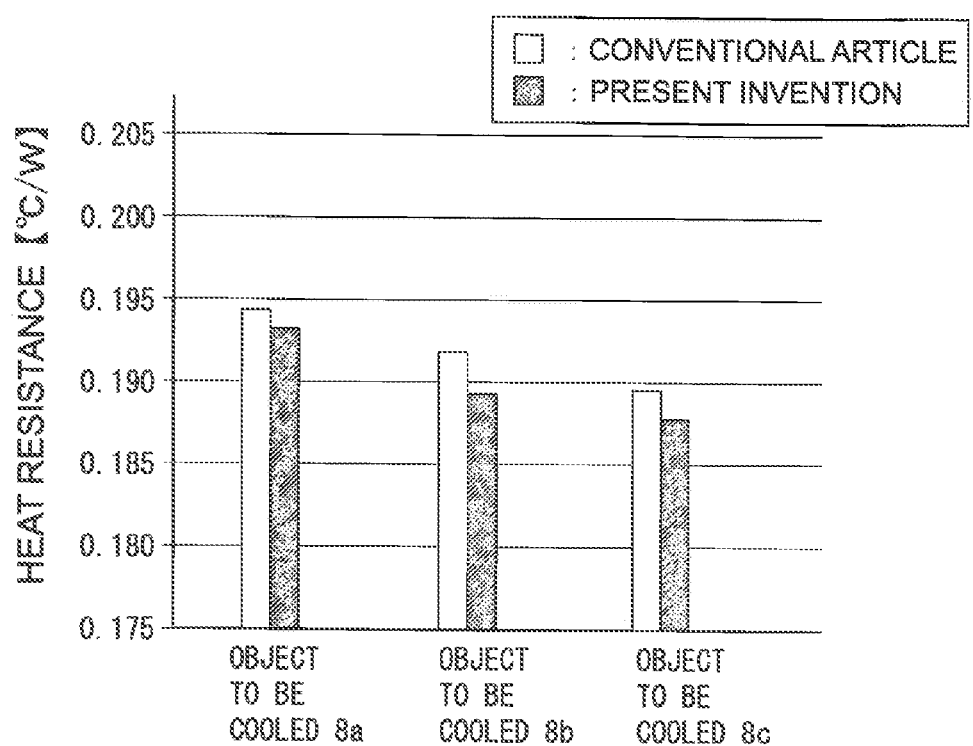
FIG. 7 illustrates an explanatory view showing a difference of heat resistance between a heat sink according to the preset invention and a heat sink of a conventional type.

Next, FIG. 7 illustrates a comparison between heat resistance of a conventional type heat sink and heat resistance of the heat sink of the present invention (arrangement of the object 8 to be cooled in FIG. 2). In FIG. 7, in each of elements, that is, in the objects 8a to 8c to be cooled, the heat resistance in the present invention is smaller than that in the conventional type. Meanwhile, the heat resistance here is a value that shows difficulty of temperature transmission, and means temperature rise per unit time and per quantity of heat generation with a unit of ° C./W.

In FIG. 7, white in the bar graph shows the heat resistance of the conventional laminated type heat sink in which respective plates are identical. In contrast, the heat resistance of the heat sink of the present invention is shown by slash marks in each bar graph. As an example, with respect to the object 8a to be cooled, the heat resistance of the conventional article is 0.194° C./W. In contrast, the heat resistance in the present invention is 0.193° C./W.

Example 4

Figure 8:
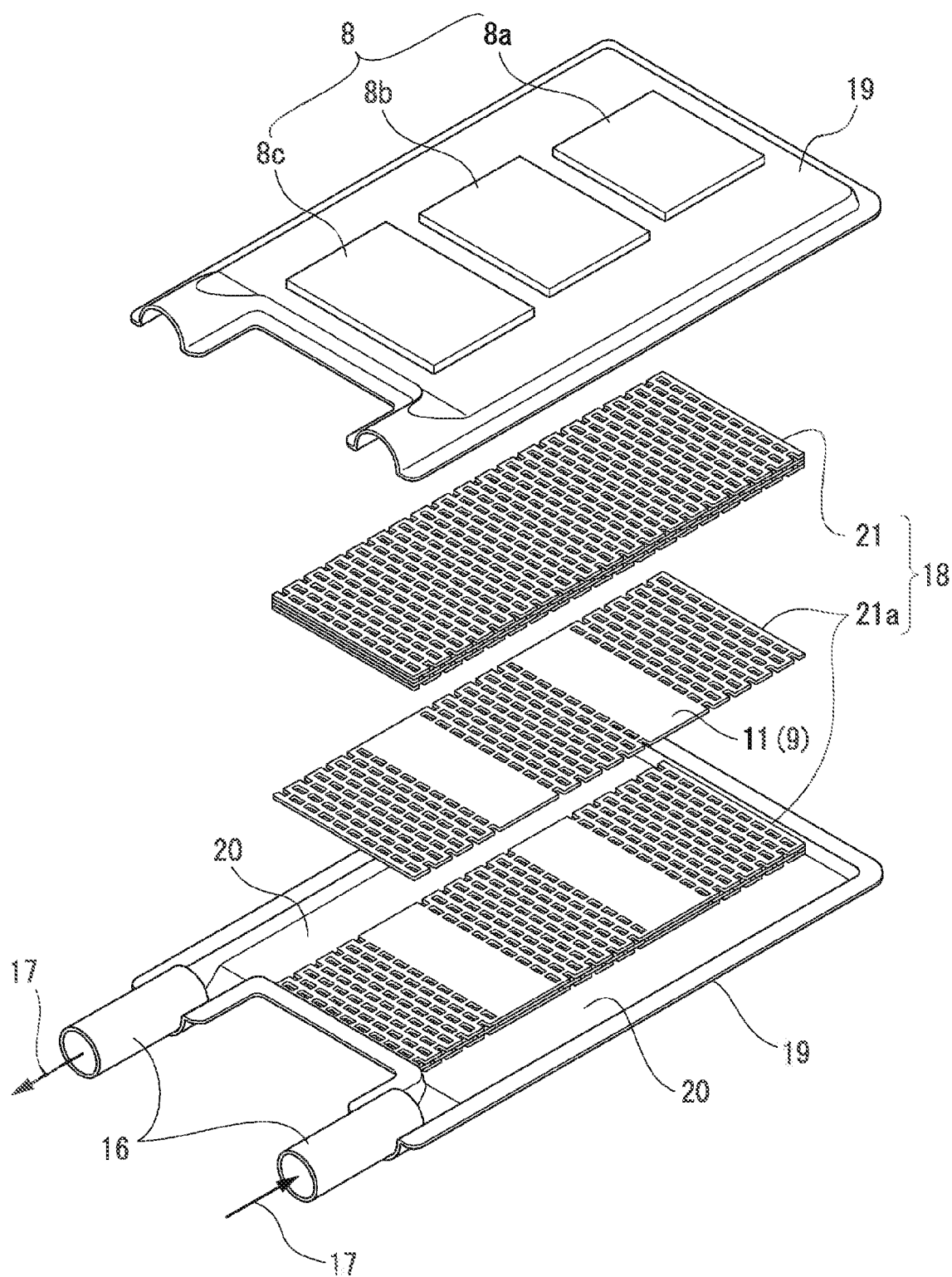
FIG. 8 illustrates an exploded perspective view of a laminated type heat sink in fourth Example of the present invention.

Next, FIG. 8 illustrates an exploded perspective view of fourth Example of the present invention. The different point of this from the invention in FIG. 1 is that a frame part of the periphery of each of the plates 6 in FIG. 1 is removed. The core 18 is formed by a laminated body of plates 21, and the core 18 is mounted inside a casing 19. With respect to the casing, in the example, a pair of dish-like plates are sealed with a flange part of periphery and the pair of inlet/outlet pipes 16 are projected from an end part. In the example, the blank part 11 exists in two positions in a second plate 21*a* without a frame, and the blank part 11 forms the circulation blocking means 9.

Example 5

Figure 9:
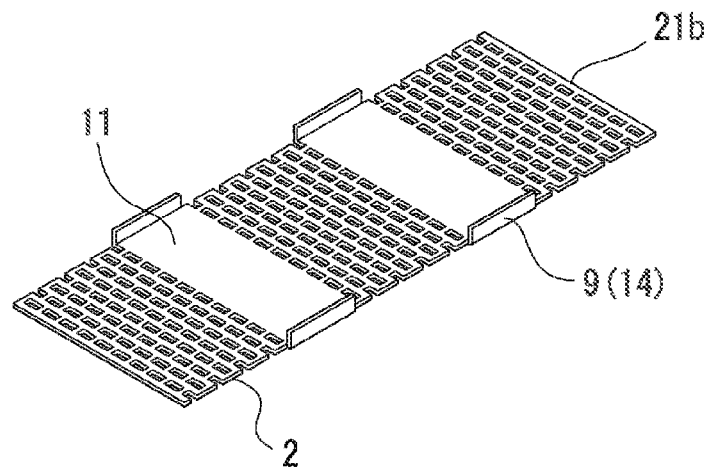
FIG. 9 illustrates an exploded perspective view of a laminated type heat sink in fifth Example of the present invention.
Figure 9:
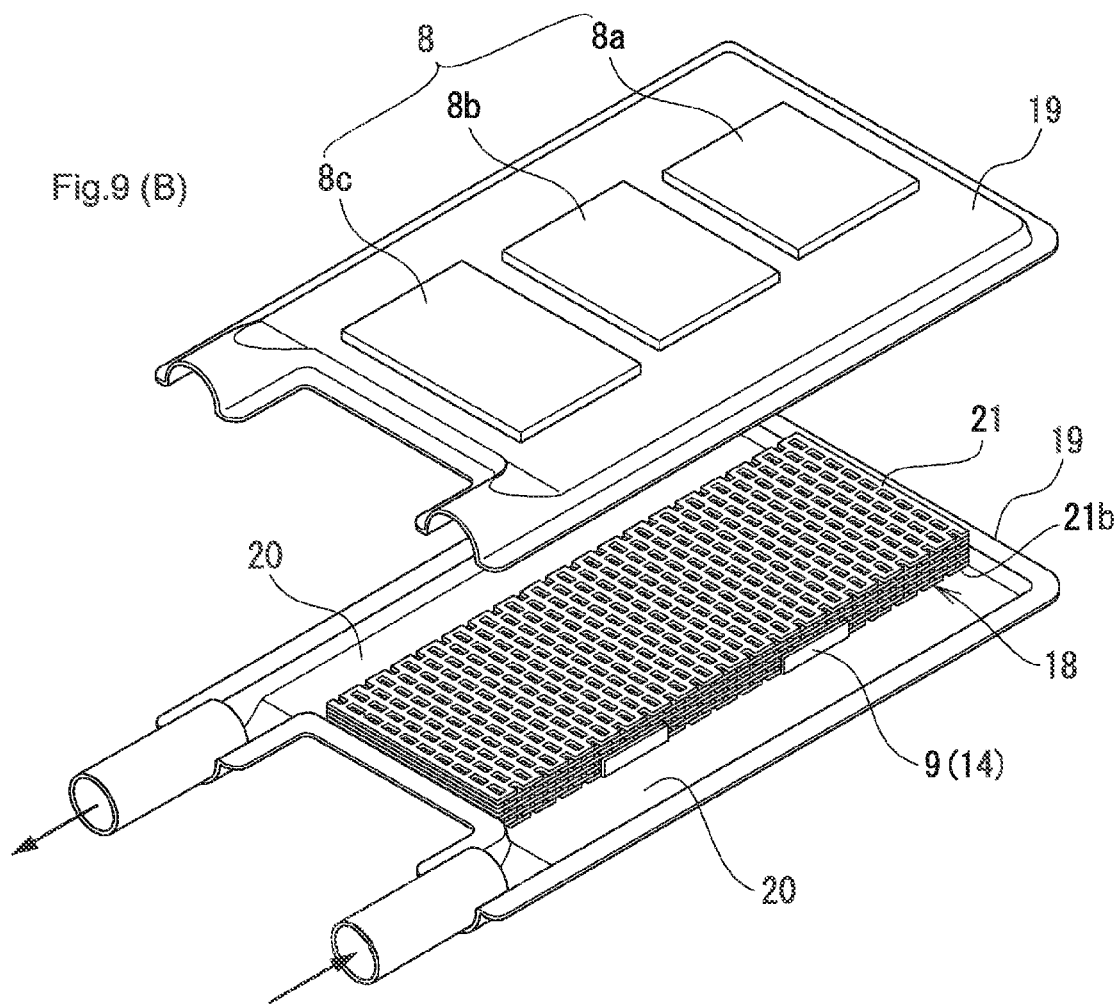

Next, FIG. 9 illustrates an exploded perspective view of fifth Example of the present invention. The different point of this from the invention in FIG. 4 is that a frame part of the periphery of each of the plates 6 in FIG. 4 is removed.

Example 6

Figure 10:
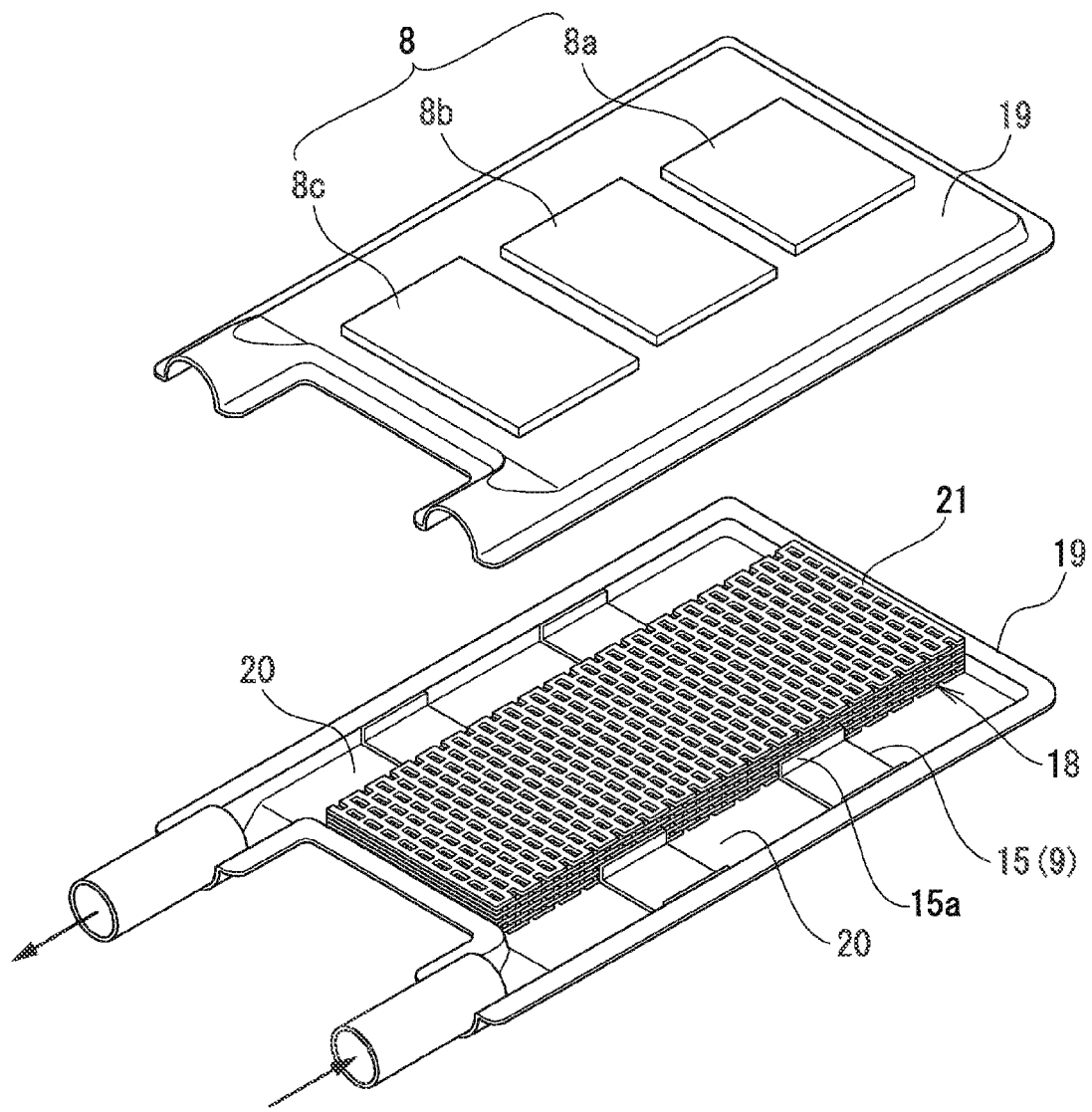
FIG. 10 illustrates an exploded perspective view of a laminated type heat sink in sixth Example of the present invention.

Next, FIG. 10 illustrates an exploded perspective view of sixth Example of the present invention. The different point of this from the invention in FIG. 5 is that a frame part of the periphery of each of the plates 6 in FIG. 5 is removed.

The present invention can be used for cooling a semiconductor such as an inverter.

The invention claimed is:

1. A heat sink, comprising:
   a laminated core comprising a plurality of flat metal plates in a laminated configuration, each of the plates having a plurality of mutually parallel slits formed therethrough to define a plurality of mutually parallel longitudinal ribs and a plurality of mutually parallel transverse ribs, the transverse ribs linking respective adjacent ones of the longitudinal ribs, the longitudinal ribs and the transverse ribs forming the perimeters of the slits and constituting fins extending continuously over the area of the faces of the plates including from one longitudinal edge to another longitudinal edge of the plates, the faces being orthogonal to the direction of lamination; and
   a pair of lids each of which is laminated to a respective end one of the plates of the laminated core;
   wherein the longitudinal ribs of each of the plates is in registry with the longitudinal ribs of all the other of the plates,
   wherein the transverse ribs of some of the plates are not in registry with the transverse ribs of other of the plates,
   wherein an exterior surface of one of the lids is configured to receive an object to be cooled,
   wherein the laminated core is configured to circulate refrigerant in a longitudinal direction of the longitudinal ribs and into the slits: and
   the heat sink further comprising means for blocking the circulation of the refrigerant through a portion of at least one of the plates,
   wherein the circulation is not blocked for others of the plates, and
   wherein each of the at least one of the plates for which circulation through a portion thereof is blocked is farther in the lamination direction from the lid having an exterior surface configured to receive an object to be cooled than at least one of the plates for which the circulation of the refrigerant is not blocked.

2. The heat sink according to claim 1, further comprising:
   a manifold communicating with the slits and configured for circulating the refrigerant to and from the slits,
   wherein the manifold is formed in peripheral portions of the plates and extends longitudinally at the longitudinal edges of the plates,
   wherein the means for blocking the circulation of the refrigerant through a portion of a plate comprises a portion of that plate which, unlike the plates not having a portion through which the circulation of the refrigerant is blocked, is not provided with slits, and
   wherein a vertical projection in the lamination direction of a portion of the exterior surface of the lid which portion is configured to receive the object to be cooled is in registry with the smaller finned area of the plate having the smaller filmed area.

3. The heat sink according to claim 1, further comprising:
   a manifold communicating with the slits and configured for circulating the refrigerant to and from the slits,
   wherein the manifold is formed in peripheral portions of the plates and extends longitudinally at the longitudinal edges of the plates,
   wherein the means for blocking the circulation of the refrigerant through a portion of a plate comprises a portion of that plate which, unlike the plates not having a portion through which the circulation of the refrigerant is blocked, is not provided with slits, and the means for blocking the circulation of the refrigerant through a portion of a plate further comprises arranged at each longitudinal edge of the non-slitted portion of the plate respective members which are orthogonal to a plane of the plate and configured to block for a portion of that plate and of at least one adjacent plate the circulation of the refrigerant between the manifold and the plate, and
   wherein a vertical projection in the lamination direction of a portion of the exterior surface of the lid which portion is configured to receive the object to be cooled is in registry with an unblocked portion of each of the plates for a portion of which the circulation of the refrigerant is blocked.

4. The heat sink according to claim 1, further comprising:
   a manifold communicating with the slits and configured for circulating the refrigerant to and from the slits,
   wherein the manifold is formed in peripheral portions of the plates and extends longitudinally the longitudinal edges of the plates,
   wherein the means for blocking the circulation of the refrigerant comprises respective members received in each of the opposing manifold portions, each of the members comprising a base of width corresponding to width of the manifold portions and a leg extending from the base in the lamination direction and abutting the respective longitudinal edges of a portion of at least one of the plates to block the circulation of the refrigerant between the manifold and said portion of the at least one of the plates.

5. A heat sink, comprising:
   a laminated core comprising a plurality of flat metal plates in a laminated configuration, each of the plates having a plurality of mutually parallel slits formed therethrough to define a plurality of mutually parallel longitudinal ribs and a plurality of mutually parallel transverse ribs, the transverse ribs linking respective adjacent ones of the longitudinal ribs, the longitudinal ribs and the transverse ribs forming the perimeters of the slits and constituting fins extending continuously over the area of the faces of the plates including from one longitudinal edge to another longitudinal edge of the plates, the faces being orthogonal to the direction of lamination; and a pair of lids, at least one of the lids being concave, the lids being configured as a casing for the laminated core with the lids abutting faces of respective end ones of the plates;

wherein the longitudinal ribs of each of the plates is in registry with the longitudinal ribs of all the other of the plates, wherein the transverse ribs of some of the plates are not in registry with the transverse ribs of other of the plates, wherein an exterior surface of one of the lids is configured to receive an object to be cooled, wherein the laminated core is configured to circulate refrigerant in a longitudinal direction of the longitudinal ribs and into the slits; and the heat sink further comprising means for blocking the circulation of the refrigerant through a portion of at least one of the plates, wherein each of the at least one of the plates for which circulation through a portion thereof is blocked is farther in the lamination direction from the lid having an exterior surface configured to receive an object to be cooled than at least one of the plates for which the circulation of the refrigerant is not blocked.

6. The heat sink according to claim 5, wherein the means for blocking the circulation of the refrigerant through a portion of a plate comprises a portion of that plate which, unlike the plates not having a portion through which the circulation of the refrigerant s Hocked, is not provided with slits, and wherein a vertical projection in the lamination direction of a portion of the exterior surface of the lid which portion is configured to receive the object to be cooled is in registry with the smaller finned area of the plates having a smaller area.

7. The heat sink according to claim 5, wherein the means for blocking the circulation of the refrigerant through a portion of a plate comprises a portion of that plate which, unlike the plates not having a portion through which the circulation of the refrigerant is blocked, is not provided with slits, and the means fOr blocking the circulation of the refrigerant through a portion of a plate further comprises arranged at each longitudinal edge of the non-slitted portion of the plate respective members which are orthogonal to a plane of the plate and configured to block for a portion of that plate and of at least one adjacent plate the circulation of the refrigerant through the plate, and wherein a vertical projection in the lamination direction of a portion of the exterior surface of the lid which portion is configured to receive the object to be cooled is in registry with an unblocked portion of each of the plates for a portion of which the circulation of the refrigerant is blocked.

8. The heat sink according to claim 5, further comprising a manifold formed in the casing and having respective manifold portions extending alongside the longitudinal edges of the plates and the manifold being configured for circulating the refrigerant to and from the slits, and wherein the means for Hocking the circulation of the refrigerant comprises respective members received in each of the manifold portions at mutually opposing locations, each of the members comprising a base of width corresponding to width of the manifold portions and a leg extending from the base in the lamination direction and abutting the respective longitudinal edges of a portion of at least one of the plates to block the circulation of the refrigerant between the manifold and said portion of the at least one of the plates.

* * * * *